US009484908B1

(12) United States Patent
Lu et al.

(10) Patent No.: US 9,484,908 B1
(45) Date of Patent: Nov. 1, 2016

(54) GATE DRIVE CIRCUIT

(71) Applicant: HELLA CORPORATE CENTER USA, INC., Plymouth Township, MI (US)

(72) Inventors: Juncheng Lu, Flint, MI (US); Hua Bai, Flint, MI (US)

(73) Assignee: Hella Corporate Center USA, Inc., Plymouth Township, MI (US)

( * ) Notice: Subject to any disclaimer, the term of this patent is extended or adjusted under 35 U.S.C. 154(b) by 0 days.

(21) Appl. No.: 14/744,998

(22) Filed: Jun. 19, 2015

(51) Int. Cl.
*H03K 3/00* (2006.01)
*H03K 17/13* (2006.01)
*H03K 17/687* (2006.01)

(52) U.S. Cl.
CPC ........ *H03K 17/133* (2013.01); *H03K 17/6871* (2013.01)

(58) Field of Classification Search
None
See application file for complete search history.

(56) References Cited

U.S. PATENT DOCUMENTS

| 5,309,343 | A | 5/1994 | Schlenk | |
|---|---|---|---|---|
| 7,176,729 | B2 * | 2/2007 | Hayashi | H03K 19/018557 327/108 |
| 8,530,996 | B2 | 9/2013 | Shono | |
| 8,847,656 | B1 | 9/2014 | A et al. | |
| 2003/0006810 | A1 * | 1/2003 | Miyazaki | H03K 17/166 327/108 |
| 2008/0211548 | A1 * | 9/2008 | Hayashi | H03K 19/018585 327/108 |
| 2013/0049814 | A1 * | 2/2013 | De Rooij | H01L 27/0207 327/108 |
| 2014/0218993 | A1 * | 8/2014 | Permuy | H02M 7/537 363/131 |

FOREIGN PATENT DOCUMENTS

| EP | 2154784 A1 | 2/2010 |
|---|---|---|
| EP | 2242179 A1 | 10/2010 |
| EP | 2597767 A2 | 5/2013 |
| WO | 2015001311 A1 | 1/2015 |
| WO | 2015022860 A1 | 2/2015 |

OTHER PUBLICATIONS

Pathak, "MOSFET/IGBT Drivers Theory and Applications," 2001 IXYS Corporation [online] [retrieved Sep. 29, 2015]. Retrieved from the internet: URL:http://www.ixys.com/documents/appnotes/ixan0010.pdf.
Peng et al., "Characterization and Modeling of a Gallium Nitride Power HEMT," Energy Conversion Congress and Exposition (ECCE), 2014 IEEE, Sep. 14-18, 2014.

(Continued)

*Primary Examiner* — Long Nguyen
(74) *Attorney, Agent, or Firm* — Dykema Gossett PLLC (57) ABSTRACT

A driver circuit has a gate drive terminal that produces a gate drive signal to control paralleled power semiconductor switches, such as GaN high electron mobility transistor (HEMT) devices. One of the switches is closest to the gate drive terminal such that its gate drive loop inductance is smaller than the remaining switches that are farther away having a larger loop inductance. An additional resistor or gate-source capacitor is provided in the gate drive circuit of the closest switch which increases the total gate resistance of the closest switch compared to the remaining switches, which delays the turn off time of the closest switch. The delay permits zero voltage switching turn-off of the remaining switches to reduce noise. The closest switch is hard switched off but has the smallest loop inductance, which allows optimized turn off.

16 Claims, 3 Drawing Sheets

(56) References Cited

OTHER PUBLICATIONS

Ramanan et al., "Device Modeling for Understanding AlGaN/GaN HEMT Gate-Lag," IEEE Transactions on Electron Devices, vol. 61, No. 6, pp. 2012-2018, 2014.
Pengelly et al., "A Review of GaN on SiC High Electron-Mobility Power Transistors and MMICs," 2012, IEEE (reprinted from IEEE Transactions on Microwave Theory and Techniques, vol. 60, No. 6, Jun. 2012) [online] [retrieved Sep. 29, 2015]. Retrieved from the internet: URL:http://www.cree.com/sitecore%20modules/web/~/media/Files/Cree/RF/Papers%20and%20Articles/101A_Review_of_GaN_on_SiC_HEMTs_and_MMICs.pdf.
Joshin et al., Outlook for GaN HEMT Technology, FUJITSU Sci. Tech. J., vol. 50, No. 1, pp. 138-143, Jan. 2014 [online] [retrieved Sep. 29, 2015]. Retrieved from the internet: URL:http://www.fujitsu.com/global/documents/about/resources/publications/fstj/archives/vol50-1/paper21.pdf.
Andreycak, "Zero Voltage Switching Resonant Power Conversion," Unitrode Application Note, U-138, 1999, Texas Instruments Inc. [online] [retrieved Sep. 29, 2015]. Retrieved from the internet: URL:http://www.ti.com/lit/an/slua159/slua159.pdf.
"Rectifiers for Power Factor Correction (PFC)," Application Note, Vishay General Semiconductor, Rev. Jul. 23, 2008.
Lindemann, "Rectifiers with Power Factor Correction," IXYS Semiconductor GmbH.
"N-channel 650 V, 0.014 Ω typ., 130 A, MDmesh V Power MOSFET in Max247 package," STY139N65M5, Datasheet-production data, Jan. 2013.
"Top cooled 650V enhancement mode GaN transistor," GS66516T, Preliminary Datasheet, GaN Systems, Inc., Rev. Apr. 6, 2015.
"14-Ampere Low-Side Ultrafast MOSFET Drivers," IXD_614, IXYS Integrated Circuits Division, Jan. 6, 2015.
ANSYS Maxwell Brochure, Ansys, Inc., 2015 [online] [retrieved Sep. 30, 2015]. <Retrieved from the internet: URL:http://www.ansys.com/staticassets/ANSYS/staticassets/resourcelibrary/brochure/ansys-maxwell-brochure.pdf.
English Abstract of WO 2015022860 (Feb. 19, 2015, Nissan Motor Co., Ltd.).
English Abstract of EP 2 154 784 (Feb. 17, 2010, Semikron Elektronik GmbH).
International Search Report (Jul. 22, 2016), issued in corresponding International (PCT) Patent Application No. PCT/US2016/032366.

\* cited by examiner

GATE DRIVE CIRCUIT

CROSS-REFERENCE TO RELATED APPLICATIONS

Not applicable.

BACKGROUND a. Technical Field

The instant disclosure relates generally to power electronics systems, and more particularly to a gate drive circuit for a power electronics system that includes a plurality of semiconductor switches connected in a paralleled arrangement.

b. Background

This background description is set forth below for the purpose of providing context only. Therefore, any aspects of this background description, to the extent that it does not otherwise qualify as prior art, is neither expressly nor impliedly admitted as prior art against the instant disclosure.

In a power electronics circuit, a high-current power capability can be provided by electrically connecting a plurality of semiconductor switches in a paralleled arrangement so as to permit the undertaking of the load current together. Switches such as Si MOSFETs or GaN high electron mobility transistor (HEMTs) devices can be used in such a paralleled arrangement because they have a much lower conduction resistance compared to a single switch, which will reduce the conduction loss to thereby increase the overall system efficiency.

To avoid a current imbalance in both dynamic and steady states, identical gate-drive resistance and capacitance can be given to each switch in the parallel arrangement. In other words, it is typical to deploy the same gate drive circuit for each switch in a paralleled switch arrangement. However, there can be differences among the multiple switches in this arrangement, e.g., due to the circuit layout, one switch might be physically closer than another switch to a gate-drive chip that is provided for generating a gate drive signal to turn the switches on and off. These differences can cause problems in the operation of the paralleled switch circuit.

The switch that is physically closer to the gate-drive chip (i.e., the near switch) will have a relatively smaller loop inductance, while the switch or switches that are physically farther away from (i.e., the far switch) will have a longer gate-loop length resulting in a larger loop inductance. In a fast switching application, such as a paralleled switch arrangement that includes, for example, GaN HEMTs devices, the differences in the gate loop inductance can cause the switches to turn on and off at different speeds, as well as possibly cause an oscillation of the gate voltage and/or mis-trigger one or more of the switches.

Figure 3:
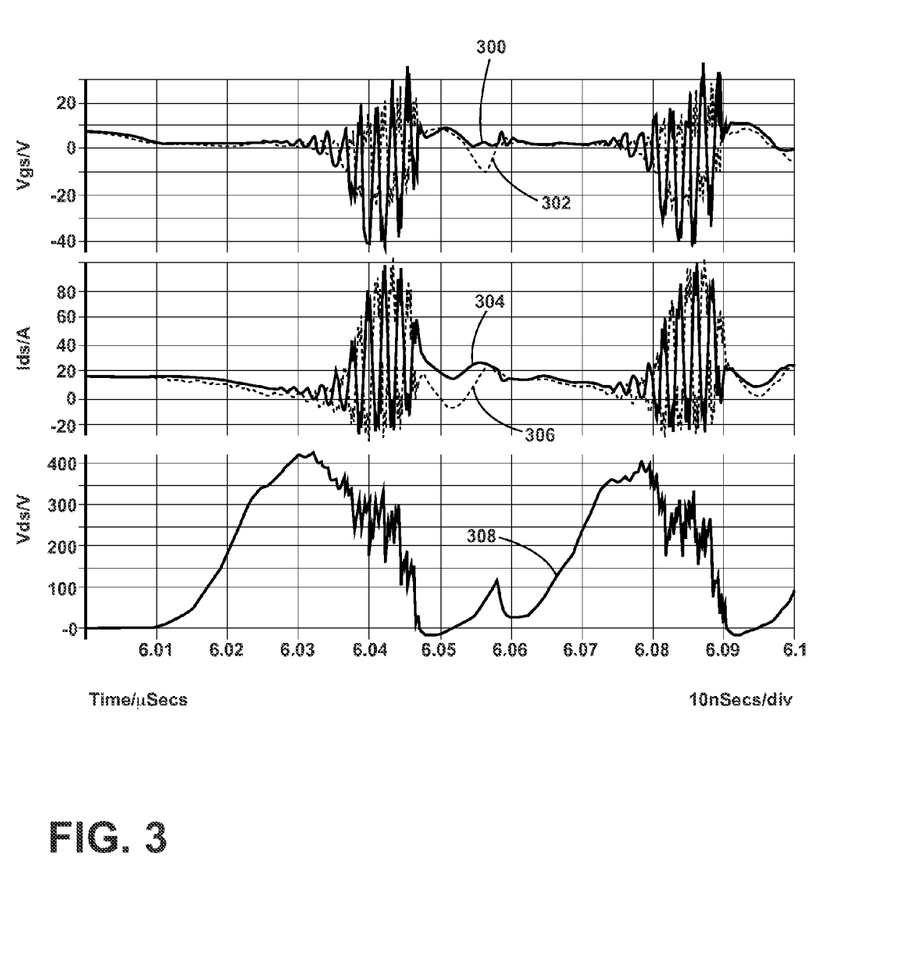
FIG. 3 shows simplified, respective timing diagrams of a gate-source voltage, a drain-source current, and a drain-source voltage for near and far switches.

For example, FIG. 3 shows respective timing diagrams of a gate-source voltage ($V_{gs}$), a drain-source current ($I_{ds}$), and a drain-source voltage ($V_{ds}$) for both a near switch and a far switch. For illustration purposes, the near switch is assumed to have an associated gate-drive loop inductance of about 1 nH and the far switch is assumed to have an associated gate-drive loop inductance of about 2 nH. Additionally, assume that both the near and far switches have the same gate resistance. In the top timing diagram, trace 300 represents the far switch and trace 302 represents the near switch.

When the gate drive signal (from the gate drive chip) transitions from an on state to an off state, the above-mentioned differences in the gate loop inductance cause an oscillation of the gate voltage, which in turn affects the switch voltage and current. In the middle timing diagram, trace 304 represents the far switch and trace 302 represents the near switch. As shown, the current $I_{ds}$ also shows oscillation, as does the voltage $V_{ds}$ trace 308 (far switch). Such oscillations can cause mis-triggering of the switches, which in turn can result in unexpected and/or undesired operation of the system (e.g., bridge shoot-through or damage to the gate).

The foregoing discussion is intended only to illustrate the present field and should not be taken as a disavowal of claim scope.

SUMMARY

As set forth in the Background, it is typical to assign the same gate drive circuit to all switches in a paralleled switch arrangement. By distinguishing the gate drive loop for paralleled switches, the switch with the lowest loop inductance can be controlled to turn off later than the remaining switches. The remaining switches with a relatively larger gate drive loop inductance will be naturally turning off (i.e., as set forth herein, in an embodiment, in a zero voltage turn-off switching fashion), which will reduce oscillation of the type described above in connection with FIG. 3.

An apparatus according to the instant disclosure includes a driver circuit mounted on a circuit board and having a gate drive terminal. The driver circuit is configured to produce a gate drive signal on the gate drive terminal. The apparatus also includes (i) a first semiconductor switch mounted on the circuit board and having a first gate, a first drain, and a first source, and (ii) a second semiconductor switch mounted on the circuit board and having a second gate, a second drain, and a second source. The first and second semiconductor switches are connected in a paralleled arrangement wherein (i) the first drain and the second drain are electrically connected and (ii) the first source and the second source are electrically connected.

The apparatus further includes a first electrical connection between the gate drive terminal of the driver circuit and the first gate of the first semiconductor switch wherein the first electrical connection has first length and comprises electrically conductive material with an associated first inductance. The apparatus also includes a second electrical connection, different from the first electrical connection, between the gate drive terminal and the second gate of the second semiconductor switch wherein the second electrical connection has a second length and comprises electrically conductive material with an associated second inductance. The second length is longer than the first length such that the second inductance is larger than the first inductance. The first electrical connection includes an impedance element, such as a resistor connected in series in said first electrical connection or a capacitor connected across said first gate and source, that is configured to delay a first turn-off time of the first semiconductor switch relative to a second turn-off time of the second semiconductor switch.

The foregoing and other aspects, features, details, utilities, and advantages of the present disclosure will be apparent from reading the following description and claims, and from reviewing the accompanying drawings.

DETAILED DESCRIPTION

Various embodiments are described herein to various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments, the scope of which is defined solely by the appended claims.

Reference throughout the specification to "various embodiments," "some embodiments," "one embodiment," or "an embodiment," or the like, means that a particular feature, structure, or characteristic described in connection with the embodiment is included in at least one embodiment. Thus, appearances of the phrases "in various embodiments," "in some embodiments," "in one embodiment," or "in an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation given that such combination is not illogical or non-functional.

Before proceeding to a detailed description of an embodiment of the instant disclosure, a general overview description will first be set forth. As described in the Background, there can be a gate loop inductance difference among various switches in a paralleled switch power electronics apparatus (i.e., usually the switch that is further away from the gate-drive chip has a longer loop length and thus has an increased loop inductance relative to the near/closer switch). One option to address this problem is to take special care when the circuit layout is performed, so that the gate-driver chip is maintained at the same distance with respect to the gate of every single switch. However, in most circuit layouts, maintaining equal chip-to-switch distances is difficult to realize.

Accordingly, in various embodiments, the gate drive loop for the paralleled switches are distinguished one from the other, with the switch with the lowest loop inductance being controlled—by virtue of its gate drive circuit design—to turn off later than the remaining switches. In an embodiment, such gate drive circuit design includes providing an additional resistor or gate-source capacitor(s) in the gate drive path while configuring the drive for the other switches to have equal (to each other) but lower gate resistance or capacitance. The additional resistor or capacitor(s) increase the gate resistance or capacitance and therefore delays the turn off time relative to the other switches, which remaining switches turn off first and in a more desirable fashion. In an embodiment, the remaining switches with the larger gate drive loop inductance will be naturally turning off (i.e., turning off in a zero voltage turn off switching fashion). This approach reduces gate-to-source and drain-to-source oscillation of the type described in connection with FIG. 3.

Figures 1A, 1B:
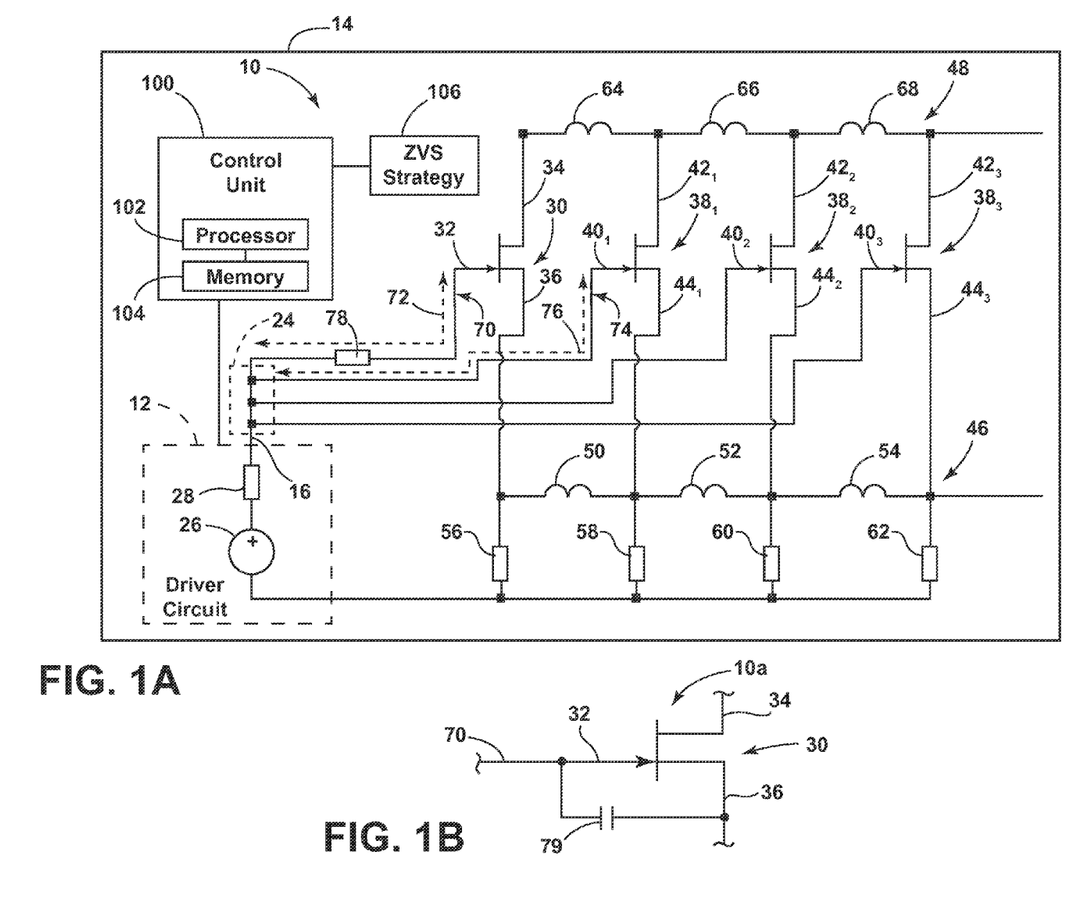
FIG. 1A is diagrammatic schematic and block diagram of an apparatus with paralleled transistors with an improved gate drive circuit according to an embodiment of the instant disclosure.
FIG. 1B is a schematic diagram of an alternate embodiment using a gate-source capacitor to delay turn off of the first semiconductor switch in FIG. 1A.

Referring now to the drawings wherein like reference numerals are used to identify identical or similar components in the various views, FIG. 1A is a diagrammatic view of an embodiment of an apparatus 10. Apparatus 10 comprises a paralleled semiconductor switch arrangement suitable for use in a power electronics system. For example, apparatus 10 may be used in a wide variety of applications where electrical current can be increased by electrically connecting plural switches in parallel to increase current-carrying capability. The embodiment of FIG. 1A may be considered a single switching module that can be connected with respect to a load(s) and/or power source in a variety of ways known in the art.

In the illustrated embodiment, apparatus 10 includes a driver circuit 12 mounted on a circuit board 14 and having at least one gate drive terminal 16. The driver circuit 12 may comprise a semiconductor chip and further be configured to respond to a variety of input signals (e.g., voltage and/or current inputs) in order to output, among other things, a semiconductor switch gate drive signal 18 (best shown in FIG. 2A) at the gate drive terminal 16. In particular, the driver circuit 12 may produce the gate drive signal 18 in accordance with a predetermined control approach. The art is replete with exemplary control strategies, and is dependent on the particular application.

Additionally, the gate drive signal 18 includes at least an ON state 20 and an OFF state 22. In an embodiment, the ON state 20, when asserted by driver circuit 12, is configured to turn on a target semiconductor switch, while the OFF state 22, when asserted, is conversely configured to turn off the target semiconductor switch.

The gate drive terminal 16 may be part of an electrical node 24 on the circuit board 14, which is diagrammatically enclosed in a dashed-line box 24. As further shown, driver circuit 12 includes a voltage source 26 and an internal resistive element 28 (i.e., note this is a simplified representation of the driver circuit 12 illustrated for clarity purposes). The driver circuit 12 can comprise commercially available components (i.e., a commercially available chip known in the art, for example, a gate drive chip available under part number IXD_614 from IXYS Corporation, Milpitas, Calif., USA).

While FIG. 1A shows a driver circuit 12, which can be a specific control device, apparatus 10 may additionally include, or may have as a substitute for the driver circuit 12, an electronic control unit (ECU) 100 that is configured to implement a desired control strategy for the operation of apparatus 10. ECU 100 includes a processor 102 and a memory 104. Processor 102 may include processing capabilities as well as an input/output (I/O) interface through which processor 102 may receive a plurality of input signals and generate a plurality of output signals (e.g., gate drive signal, in an embodiment). Memory 104 is provided for storage of data and instructions or code (i.e., software) for processor 102. Memory 26 may include various forms of non-volatile (i.e., non-transitory) memory including flash memory or read only memory (ROM) including various forms of programmable read only memory (e.g., PROM, EPROM, EEPROM) and/or volatile memory including random access memory (RAM) including static random access memory (SRAM), dynamic random access memory (DRAM) and synchronous dynamic random access memory (SDRAM). While the instant disclosure describes a gate drive circuit for improved device turn-off in a paralleled switch arrangement, switch turn-on may be controlled by way of known control approaches. In an embodiment, one approach for device turn-on control may be to employ a zero voltage switching (ZVS) strategy. As shown, the control strategy for turn-off control and turn-on control (including the ZVS control) can be implemented in terms of control logic 106, which comprises processor instructions that can be stored in memory 104 and are configured to be executed by processor 102. Alternatively, the operational control logic for controlling the operation of apparatus 10 (i.e., turn-off and turn-on control) can be implemented in hardware.

With continued reference to FIG. 1A, apparatus 10 further includes a plurality of semiconductor switches electrically connected in a paralleled arrangement to provide for increased current-carrying capability. In the instant disclosure, one of the plurality of switches is closer to gate drive terminal 16 of driver circuit 12 than the remainder of the switches (i.e., there is one or more switches that are farther from gate drive terminal).

In this regard, apparatus 10 includes a first semiconductor switch 30 mounted on circuit board 14, which includes a first gate 32, a first drain 34, and a first source 36. Apparatus 10 also includes one or more second semiconductor switches mounted on the circuit board 14 which are designated switches $38_1, 38_2, 38_3, \ldots, 38_n$ (switch $38_n$ is not shown). The second semiconductor switches $38_n$ (n=1, 2, 3, ...) are all farther distance-wise from gate drive terminal 16 than is first semiconductor switch 30. For example, a first electrical connection 70 formed between the gate drive terminal 16 and the gate 32 of first semiconductor switch 30 has a first length 72. Since the connection 70 is formed with electrically conductive material—such as a trace on the circuit board 14—it has an associated first gate loop inductance. In contrast, a second electrical connection 74 formed between the gate drive terminal 16 and the gate $40_1$ of second semiconductor switch $38_1$ has a second length 76. Since the second length 76 is greater than the first length 72, the associated second gate loop inductance is likewise also greater than the first gate loop inductance. The remaining, further second semiconductor switches $38_2, 38_3, \ldots, 38_n$, each also have a respective electrical connection of a certain length formed of electrically conductive material having an associated gate loop inductance—these electrical connection(s) are also all longer than the first length 72 and thus also have a greater loop inductance than that associated with first switch 30.

Each of the second semiconductor switches $38_n$ includes a respective gate, drain, and source, namely: second semiconductor switch $38_1$ includes a second gate $40_1$, a second drain $42_1$, and a second source $44_1$; second semiconductor switch $38_2$ includes a second gate $40_2$, a second drain $42_2$, and a second source $44_2$; and second semiconductor switch $38_3$ includes a second gate $40_3$, a second drain $42_3$, and a second source $44_3$. The first semiconductor switch 30 and the one or more second semiconductor switches $38_1, 38_2, 38_3$ may comprise power semiconductor transistor devices known in the art, for example Si MOSFET devices or GaN High Electron Mobility Transistor (HEMT) devices. The first and second semiconductor switches 30, $38n$ may comprise commercially available components, for example, an enhancement mode GaN transistor provided under the trade designation and/or part number GS66516T from GaN Systems Corp., Ann Arbor, Mich., USA, or an N-Channel power MOSFET provided under the trade designation and/or part number STY139N65M5 from STMicroelectronics, Coppell, Tex., USA. In regard to the turn-on and turn-off states of the gate drive signal, the specific voltage range will be determined by the specific device characteristics of the semiconductor switches 30 and $38_1, 38_2, 38_3$. In an embodiment, a Vgs threshold for the switches may be about 1.6 volts, with a turn on signal of about 7 volts (i.e., gate drive signal 18) to turn on the switches and with a turn off signal of about −5 volts to turn off the switches (i.e., gate drive signal 18).

As described above, first semiconductor switch 30 and the one or more second semiconductor switches $38_1, 38_2, 38_3$ are electrically connected in a paralleled switch arrangement wherein (i) the first source 36 and the one or more second sources $44_1, 44_2, 44_3$, are electrically connected at one node 46 and (ii) the first drain 34 and the one or more second drains $42_1, 42_2, 42_3$, are electrically connected at another node 48. The electrical interconnections between the source(s) at node 46 can be characterized as having a parasitic inductance, which is represented in FIG. 1 by respective inductance elements 50, 52, and 54. Likewise, the electrical interconnections between the drain(s) at node 48 can be characterized as having a parasitic inductance, which is represented by inductance elements 64, 66, and 68.

Gate Drive Circuit Resistance.

The controlled turn-off approach described herein is achieved, in an embodiment, through selection of suitable gate resistance(s). Apparatus 10 includes resistors 56, 58, 60, and 62, which are electrically connected between the respective source(s) of semiconductor switches 30, $38_1, 38_2$, and $38_3$ and a ground (node). The resistors 56, 58, 60, and 62 constitute gate resistances for their respective semiconductor switches. As to the second semiconductor switches $38_1, 38_2$, and $38_3$, the gate resistance is the resistance values for resistors 58, 60, and 62, which in an embodiment are all equal resistance values. As to the first semiconductor switch 30, however, an additional impedance element, such as a resistor 78, is provided in addition to resistor 56, so that the total gate resistance associated with first semiconductor switch 30 is the sum of resistor 78 and resistor 56.

In an embodiment, resistor 56 has the same value as resistors 58, 60, 62, so that the total gate resistance of first (near) semiconductor switch 30 is greater than the gate resistance for the second (far) semiconductor switches $38_1, 38_2, 38_3$ by at least the resistance value of resistor 78. In general, the value for resistor 78 (in combination with resistor 56) should be large enough to delay the turn-off of the semiconductor switch 30 until the one or more second semiconductor switches have all completely turned off, which may also include a suitable margin to ensure this relationship under different scenarios (e.g., operating frequency, etc.). Additionally, the value for resistor 78 (in combination with resistor 56) should not be so large as to impede the turn-on speed of first switch 30, again taking into consideration the overall application. In an embodiment, the value for resistor 78 can be set to no more than about 20 ohms. Additionally, resistor 78 should be located relatively close to the driver circuit 12 and first switch 30, which results in a smaller loop inductance compared to the remaining second (far) switches $38_n$. This will result in improved turn off performance, including reduced oscillation. In an embodiment, the value of resistors 56, 58, 60, and 62 may range between about 0 ohm and 20 ohms, and in one embodiment, may be about 1 ohm.

In sum, due to the greater gate resistance by virtue of resistor 78, the switching speed of first (near) semiconductor switch 30 will be slower than the that of the second (far) semiconductor switches. This will result in a desirable ON-to-OFF switching action (e.g., reduced noise) for the plurality of second switches $38_n$ as will be described below.

Gate Drive Circuit Capacitance.

FIG. 1B shows an alternate embodiment, namely apparatus 10a, where the additional impedance element associated with first semiconductor switch 30 comprises a gate-source capacitor 79 that is electrically connected across the first gate and first source of first semiconductor switch 30. In all other respects, apparatus 10a is the same as apparatus 10 described herein. In an embodiment, one or more gate-source capacitors 79 can be placed in the gate drive circuit of first semiconductor switch 30 (i.e., in substitution of resistor 78 and/or in addition to resistor 78), which has the effect of delaying the turn-off time of the first semiconductor switch 30 relative to the turn-off time of the second semiconductor switches $38_1$, $38_2$, $38_3$ (assuming that no corresponding gate-source capacitors are inserted in their gate drive circuit). As with the resistor 78, the gate-source capacitor 79 operates to slow down discharge of the first gate of the first semiconductor switch 30 and thus delays its turn off time relative to the second semiconductor switches. The one or more of the gate-source capacitors 79 should be selected (capacitance value) so as to delay the turn off time as noted without unduly impeding the turn-on time of switch 30. In an embodiment, the value of gate-source capacitor 79 may range between about 0 nanofarads (nF) to 10 nF, and in one embodiment, may be about 3 nF.

FIGS. 2A-2D are simplified, timing diagrams reflecting the operation of apparatus 10 in FIG. 1.

Figure 2A:
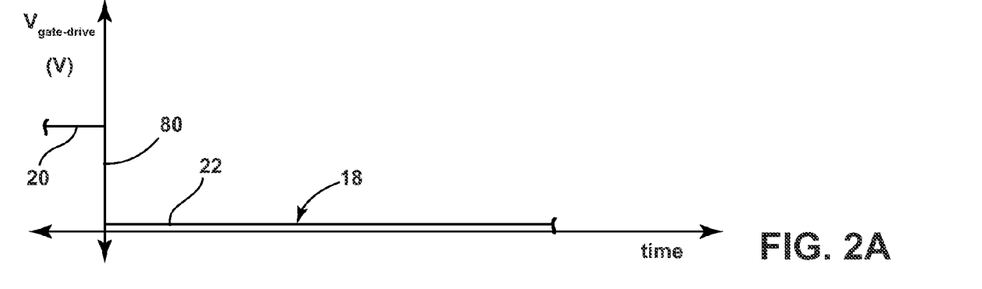
FIGS. 2A-2D are simplified, timing diagrams of a gate drive signal, a gate-source voltage, a drain-source current, and a drain-source voltage, reflecting the operation of the embodiment of FIG. 1.

FIG. 2A shows gate drive signal 18 having the ON state 20 and the OFF state 22. As further shown, gate drive signal 18 has a transition 80 from the ON state 20 to the OFF state 22.

Figure 2B:
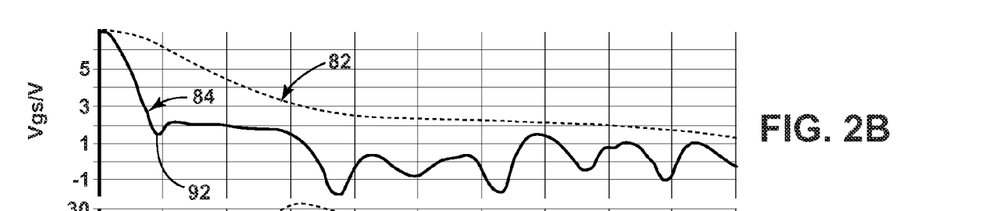

FIG. 2B shows a waveform 82 corresponding to the gate-source voltage ($V_{gs}$) of the first (near) semiconductor switch 30 and a waveform 84 corresponding to the gate-source voltage ($V_{gs}$) of one of the second (far) semiconductor switches $38_n$.

Figure 2C:
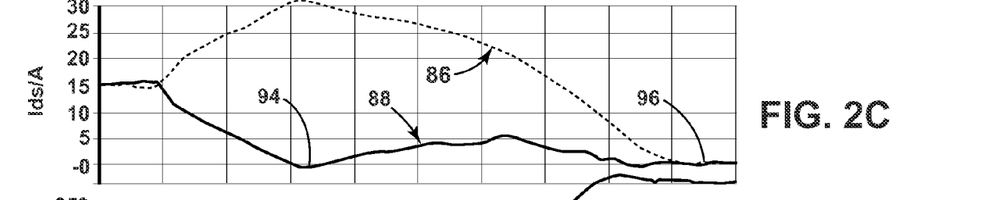

FIG. 2C shows a waveform 86 corresponding to the drain-source current ($I_{ds}$) of the first (near) semiconductor switch 30 and a waveform 88 corresponding to the drain-source current ($I_{ds}$) of one of the second (far) semiconductor switches $38_n$.

Figure 2D:
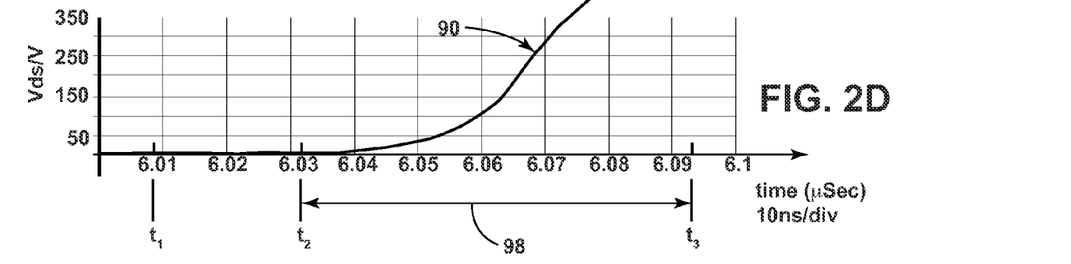

FIG. 2D shows a waveform 90 corresponding to the drain-source voltage ($V_{ds}$) of one of the second (far) semiconductor switches $38_n$.

FIGS. 2B-2D assume that the first (near) semiconductor switch 30 and the one or more second (far) semiconductor switches $38_1$, $38_2$, $38_3$ are conducting while gate drive signal 18 is in the ON state 20.

In operation, when driver circuit 12 produces the transition 80 of gate drive signal 18 (ON-to-OFF transition), the second (far) semiconductor switches $38_n$ begin to turn off first, for example only, starting at time roughly indicated as time t1 (see point 92 of waveform 84 in FIG. 2B). This is because the second (far) semiconductor switches $38_n$ have a lower gate resistance compared to the first (near) semiconductor switch 30. The increased gate resistance associated with first (near) switch 30 delays its turn off relative to the second (far) switches $38_n$. As shown, the drain-source current ($I_{ds}$) of the second (far) semiconductor switches $38_n$ continues to decrease until zero (approximately) current is reached at time t2 (e.g., at point 94 on waveform 88; FIG. 2C), which can be considered the turn off time of the second (far) semiconductor switches $38_n$. Since the first (near) semiconductor switch 30 remains on during this time interval, it will clamp the drain-source voltage ($V_{ds}$) of the second (far) semiconductor switches $38_n$ to zero, which in turn means that second (far) semiconductor switches $38n$ are zero-voltage switched off. This is shown in FIG. 2D, where the drain-source voltage ($V_{ds}$) is clamped to zero during the turn-off interval for the far switch.

During the turn-off of the second (far) semiconductor switches $38_n$, the current being carried by the second (far) semiconductor switches $38_n$ will be naturally commutated to first (near) semiconductor switch 30 with no switching noise. This is shown in FIG. 2C where, as the $I_{ds}$ of waveform 88 (far switch) decreases, one can see a corresponding increase in the $I_{ds}$ of waveform 86 (near switch). After time t2, the gate-source voltage (Vgs) and the drain-source current (Ids) associated with first (near) semiconductor switch 30 decrease until first (near) semiconductor switch 30 is turned off at time t3 (e.g., see point 96 of waveform 86—FIG. 2C). As a result, the increased gate resistance—due to resistor 78—operates to delay—by an illustrate amount of time 98—the turn off time of the first (near) semiconductor switch 30 relative to the turn off time of the second (far) semiconductor switches $38_n$. This delay ensures that the first (near) semiconductor remains on to clamp the second (far) semiconductor switches to permit a zero voltage switching off, as noted above. Note that in the embodiment where the impedance element is a gate-source capacitor 79, the effect will be the same.

Additionally, note that the first (near) semiconductor switch 30 is hard switched off, unlike the second (far) switches $38_n$. However, since first (near) semiconductor switch 30 is the closest to the gate drive terminal 16, it will have the lowest gate loop inductance. This permits optimization of the gate loop inductance to thereby reduce gate-voltage noise. For example, the switch 30 should be placed as close to the driver circuit (i.e., chip) as possible. Such location of the switch 30 might be varied based upon the stray inductance calculation or extraction through electromagnetic analysis software, e.g., MAXWELL/Q3D commercially available from Ansys, Inc., Canonsburg, Pa. U.S.A. Additionally, the turn off sequence for the embodiment of FIG. 1, as shown in FIGS. 2A-2D, eliminates the large gate oscillation as exhibited in FIG. 3. The system noise becomes much smaller.

Turn On Control.

The instant disclosure provides an improved gate circuit drive arrangement that provides advantages such as reduced noise, particularly with respect to the turn off of both the first (near) semiconductor switch 30 and the one or more second (far) semiconductor switches $38_1$, $38_2$, $38_3$, . . . , $38_n$. However, it should be noted that when the gate drive signal 18 transitions from the OFF state 22 to the ON state 20, the second (far) semiconductor switches $38_1$, $38_2$, $38_3$, . . . , $38_n$, because of their smaller gate resistance, will turn on first (i.e., prior to the first switch 30). To address this situation, in an embodiment, a suitable turn on strategy can be employed, for example, to employ a zero voltage switching (ZVS) control strategy to control switch turn-on. In an embodiment, in order to maintain zero voltage switching for switch turn-on, before the turning on action, current should reverse flow from the source to drain, which makes the switch voltage drop to zero. Thus, during the switch turn on, the switch only undertakes the current change with a voltage then-prevailing across the drain to source of the switch always being close to be zero, which in turn eliminates the turn-on loss to thereby reach the ZVS turn on. Since the reverse current happens prior to the switching-on action, the difference of switching speed will not affect the ZVS turn on. As shown in FIG. 1A, this turn-on strategy (along with a suitable turn off strategy) can be implemented in terms of a programmed control logic 106 stored in memory 104 which is configured to be executed by processor 102 to implement the control strategy.

It should be understood that an electronic control unit as described herein may include conventional processing apparatus known in the art, capable of executing pre-programmed instructions stored in an associated memory, all performing in accordance with the functionality described herein. To the extent that the methods described herein are embodied in software, the resulting software can be stored in an associated memory and can also constitute the means for performing such methods. Implementation of certain embodiments, where done so in software, would require no more than routine application of programming skills by one of ordinary skill in the art, in view of the foregoing enabling description. Such an electronic control unit may further be of the type having both ROM, RAM, a combination of non-volatile and volatile (modifiable) memory so that any software may be stored and yet allow storage and processing of dynamically produced data and/or signals.

Although only certain embodiments have been described above with a certain degree of particularity, those skilled in the art could make numerous alterations to the disclosed embodiments without departing from the scope of this disclosure. It is intended that all matter contained in the above description or shown in the accompanying drawings shall be interpreted as illustrative only and not limiting. Changes in detail or structure may be made without departing from the invention as defined in the appended claims.

Any patent, publication, or other disclosure material, in whole or in part, that is said to be incorporated by reference herein is incorporated herein only to the extent that the incorporated materials does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

While one or more particular embodiments have been shown and described, it will be understood by those of skill in the art that various changes and modifications can be made without departing from the spirit and scope of the present teachings.

What is claimed is:

1. An apparatus, comprising:
   a driver circuit mounted on a circuit board and having at least one gate drive terminal, said driver circuit being configured to produce a gate drive signal on said at least one gate drive terminal;
   a first semiconductor switch mounted on said circuit board and having a first gate, a first drain, and a first source;
   a second semiconductor switch mounted on said circuit board and having a second gate, a second drain, and a second source, said first and second semiconductor switches being connected in a paralleled arrangement wherein (i) said first drain and said second drain are electrically connected and (ii) said first source and said second source are electrically connected;
   a first electrical connection between said gate drive terminal of said driver circuit and said first gate of said first semiconductor switch wherein said first electrical connection has a first length and comprises electrically conductive material with a first inductance associated therewith;
   a second electrical connection, different from said first electrical connection, between said gate drive terminal and said second gate of said second semiconductor switch wherein said second electrical connection has a second length and comprises electrically conductive material with a second inductance associated therewith, said second length being longer than said first length such that said second inductance is larger than said first inductance; and
   an impedance element associated with said first semiconductor switch selected from the group comprising (i) a resistor that is electrically connected in series in said first electrical connection and (ii) a capacitor that is electrically connected across said first gate and said first source of said first semiconductor switch, said impedance element having an impedance value configured to delay a first turn-off time of said first semiconductor switch relative to a second turn-off time of said second semiconductor switch.

2. The apparatus of claim 1 wherein said first and second semiconductor switches have a respective gate resistive element coupled to said first source and said second source, respectively, wherein said respective gate resistive elements have an equal resistance.

3. The apparatus of claim 1 wherein said gate drive signal comprises an on state and an off state, and wherein said first turn-off time and said second turn-off time are taken with respect to a transition of said gate drive signal from said on state to said off state.

4. The apparatus of claim 1 wherein said impedance element slows said transition of said gate drive signal from said on state to said off state taken at said first gate of said first semiconductor switch to thereby achieve said delay of said first turn-off time of said first semiconductor switch.

5. The apparatus of claim 1 further comprising one or more additional second semiconductor switches electrically connected in said paralleled arrangement.

6. The apparatus of claim 1 wherein said first and second semiconductor switches comprise silicon MOSFET devices.

7. The apparatus of claim 1 wherein said first and second semiconductor switches comprise GaN high electron mobility transistor (HEMT) devices.

8. The apparatus of claim 1 wherein said impedance element comprises said resistor and wherein said resistor comprises a surface mount resistor device.

9. The apparatus of claim 1 wherein said impedance element comprises said resistor and wherein said resistor comprises a discrete resistor.

10. The apparatus of claim 1 further comprising an electronic control unit configured to control said driver circuit in accordance with a zero voltage switching (ZVS) strategy.

11. The apparatus of claim 10 wherein said electronic control unit is configured to control said driver circuit in accordance with said ZVS strategy when transitioning said gate drive signal from said off state to said on state.

12. The apparatus of claim 1 wherein said electronic control unit is configured to control said driver circuit to output said gate drive signal in said on or off state.

13. The apparatus of claim 1 wherein said impedance element comprises said resistor, and wherein a first gate resistance associated with said first semiconductor switch is greater than a second gate resistance associated with said second semiconductor switch by virtue of said resistor.

14. The apparatus of claim 5 wherein said impedance element comprises said resistor having a resistance value, and wherein a first gate resistance associated with said first semiconductor switch is greater than, by virtue of said resistor, a second gate resistance associated with (i) said second semiconductor switch and (ii) said one or more additional second semiconductor switches electrically connected in said paralleled arrangement.

15. The apparatus of claim 14 wherein said second gate resistance is approximately equal for all of said plural second semiconductor switches.

16. An apparatus, comprising:
- a driver circuit mounted on a circuit board and having at least one gate drive terminal, said driver circuit being configured to produce a gate drive signal on said at least one gate drive terminal, said gate drive signal comprising an on state and an off state;
- a first semiconductor switch mounted on said circuit board and having a first gate, a first drain, and a first source;
- a second semiconductor switch mounted on said circuit board and having a second gate, a second drain, and a second source, said first and second semiconductor switches being connected in a paralleled arrangement wherein (i) said first drain and said second drain are electrically connected and (ii) said first source and said second source are electrically connected, said first and second semiconductor switches comprising GaN high electron mobility transistor (HEMT) devices;
- a first electrical connection between said gate drive terminal of said driver circuit and said first gate of said first semiconductor switch wherein said first electrical connection has first length and comprises electrically conductive material with a first inductance associated therewith;
- a second electrical connection, different from said first electrical connection, between said gate drive terminal and said second gate of said second semiconductor switch wherein said second electrical connection has a second length and comprises electrically conductive material with a second inductance associated therewith, said second length being longer than said first length such that said second inductance is larger than said first inductance; and
- wherein said first electrical connection including a resistor having a resistive value configured to delay a first turn-off time of said first semiconductor switch relative to a second turn-off time of said second semiconductor switch, wherein said first turn-off time and said second turn-off time are taken with respect to a transition of said gate drive signal from said on state to said off state.

* * * * *